(12) United States Patent
Arendt et al.

(10) Patent No.: US 7,851,412 B2
(45) Date of Patent: Dec. 14, 2010

(54) WIDE BAND GAP SEMICONDUCTOR TEMPLATES

(75) Inventors: Paul N. Arendt, Los Alamos, NM (US); Liliana Stan, Los Alamos, NM (US); Quanxi Jia, Los Alamos, NM (US); Raymond F. DePaula, Santa Fe, NM (US); Igor O. Usov, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 279 days.

(21) Appl. No.: 11/707,611

(22) Filed: Feb. 15, 2007

(65) Prior Publication Data
US 2008/0197327 A1    Aug. 21, 2008

(51) Int. Cl.
*H01L 39/24*   (2006.01)
*H01B 1/00*   (2006.01)
*H01B 1/02*   (2006.01)
*B32B 9/00*   (2006.01)

(52) U.S. Cl. .................. 505/238; 505/237; 252/500; 252/519.51; 252/520.2; 252/521.1; 428/701; 428/702

(58) Field of Classification Search .............. 252/500, 252/519.51, 520.21, 521.1; 333/191; 505/239, 505/238, 237; 428/701, 702
See application file for complete search history.

(56) References Cited

U.S. PATENT DOCUMENTS

| | | | |
|---|---|---|---|
| 6,190,752 B1 | 2/2001 | Do et al. | |
| 6,673,478 B2 | 1/2004 | Kato et al. | |
| 6,921,741 B2 | 7/2005 | Arendt et al. | |
| 7,129,196 B2 | 10/2006 | Foltyn et al. | |
| 2006/0005108 A1* | 1/2006 | Lin | 714/776 |
| 2007/0012975 A1 | 1/2007 | Arendt et al. | |

FOREIGN PATENT DOCUMENTS

WO    WO 2007/009095    *   1/2007   ................. 252/500

OTHER PUBLICATIONS

Wang et al., Deposition of in=plane textured MgO on amorphous Si3N4 substrate by ion-beam-assisted deposition and comparisions with ion-beam-assisted deposition yttria-stabilized-zirconia Nov. 19, 1997, Applied Phys. Lett. 71 (20) 2955-2957.*
Wang et al., App. Phys. Lett., vol. 71, No. 20, pp. 2955-2957 (1997).
A. Navrotsky, J. Mater. Chem. 15, 1883-90 (2005).
A. Navrotsky, J. Mater. Chem. 15, 1883-90 (2005) Thermochemical insights into refractory ceramic materials based on oxides with large tetravalent cations.
Wang et al., Applied Phys. Lett.,vol. 71, No. 20, pp. 2955-2957 (1997 Deposition of in-plane textured MgO on amorphous Si3N4 substrate by ion-beamed-assisted deposition and comparisons with ion-beam-assisted deposited yttria-stabilized-zirconia.

* cited by examiner

*Primary Examiner*—Ling-Siu Choi
*Assistant Examiner*—Monique Peets
(74) *Attorney, Agent, or Firm*—Holly L. Teeter; Bruce H. Cottrell; Juliet A. Jones

(57) ABSTRACT

The present invention relates to a thin film structure based on an epitaxial (111)-oriented rare earth-Group IVB oxide on the cubic (001) MgO terminated surface and the ion-beam-assisted deposition ("IBAD") techniques that are amendable to be over coated by semiconductors with hexagonal crystal structures. The IBAD magnesium oxide ("MgO") technology, in conjunction with certain template materials, is used to fabricate the desired thin film array. Similarly, IBAD MgO with appropriate template layers can be used for semiconductors with cubic type crystal structures.

23 Claims, 7 Drawing Sheets

WIDE BAND GAP SEMICONDUCTOR TEMPLATES

STATEMENT OF FEDERAL RIGHTS

The United States government has rights in this invention pursuant to Contract No. DE-AC52-06NA25396 between the United States Department of Energy and Los Alamos National Security, LLC for the operation of Los Alamos National Laboratory.

FIELD OF INVENTION

The present invention relates to the development of large-area substrate platforms for hexagonally structured wide band gap semiconductors.

BACKGROUND OF THE INVENTION

Large area wide band gap semiconductors are desirable for various electronic applications. The current state-of-the-art for most of these materials is limited to three to four inch diameter wafers because growing large area single crystal platforms is difficult and expensive. Moreover, a thermal expansion mismatch exists with available template platforms.

If inexpensive large area templates were available with thermal expansion coefficients that matched that of semiconductors of interest, then production costs would decrease dramatically and the field of applications would be significantly increased.

Accordingly, there is a need for the development of less expensive large area substrate platforms for wide band gap semiconducting materials.

SUMMARY OF THE INVENTION

The present invention provides a thin film structure including a layer of a rare earth-Group IVB oxide buffer upon a layer of an oriented cubic oxide material having a rock-salt-like structure. In particular, the Group IVB oxide can be hafnium oxide or zirconium oxide. The resulting structure can serve as a large area template for wide band gap semiconductors.

In another embodiment of the invention a substrate can be included below the layer of an oriented cubic oxide material having a rock-salt-like structure.

In another embodiment of the invention a layer of a c-axis oriented wide band gap semiconductor can be added upon the rare earth-Group IVB oxide buffer.

In another embodiment of the invention the thin film structure includes a substrate; a layer of an oriented cubic oxide material having a rock-salt-like structure upon said substrate; a layer of a rare earth-Group IVB oxide buffer upon said layer of an oriented cubic oxide material having a rock-salt-like structure; and a layer of c-axis oriented wide band gap semiconductor upon said layer of rare earth-Group IVB oxide buffer.

DETAILED DESCRIPTION

Figure 1:
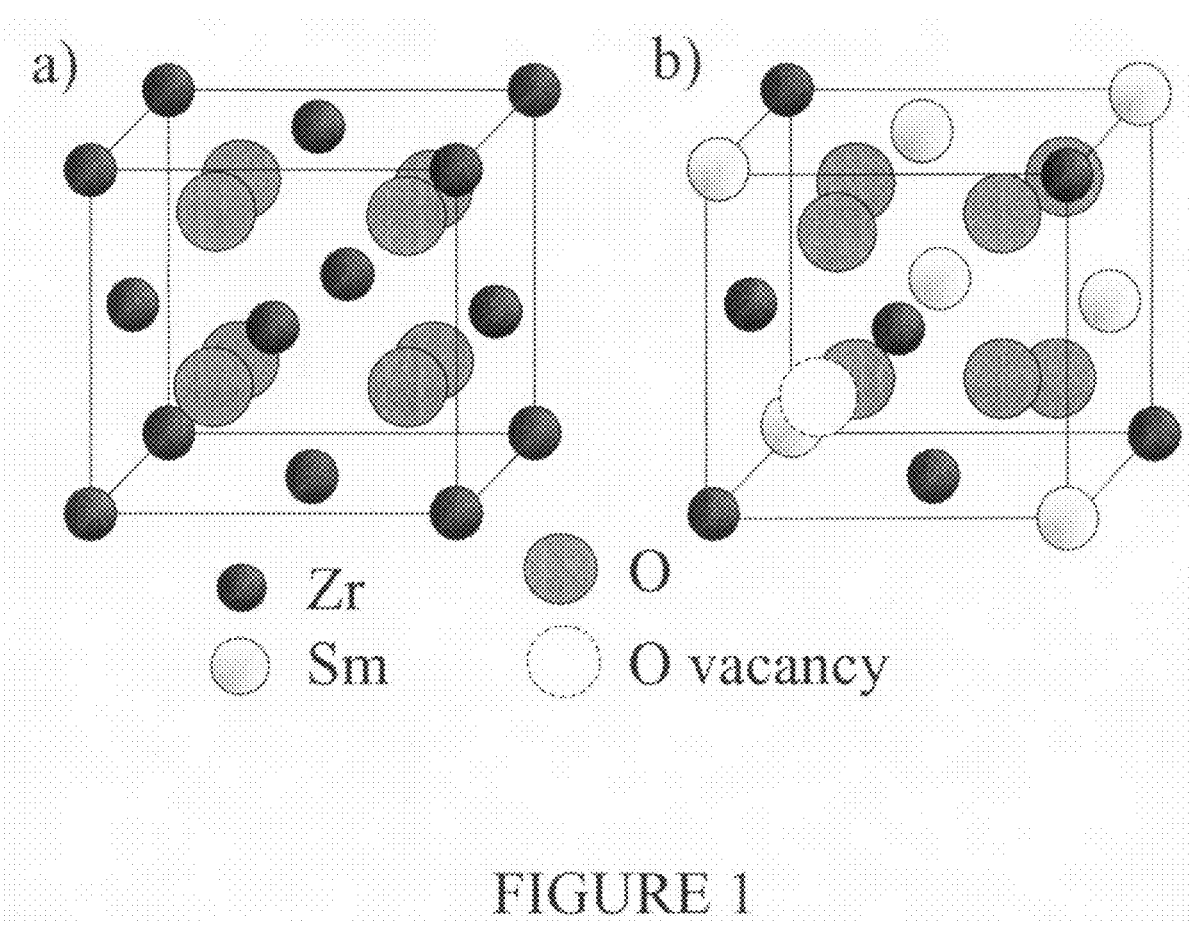
FIG. 1 shows how samarium zirconate ("SZO") varies in crystal structure and oxygen content according to composition.

This invention allows for the development of large area substrate platforms for hexagonally structured wide band gap semiconducting materials. More specifically, the invention relates to a rare earth-Group IVB oxide buffer upon a layer of oriented cubic oxide material having a rock-salt-like structure. Such combination is suitable as a substrate platform or template for hexagonally structured wide band gap semiconducting materials.

Examples of rare earth metals include, but are not limited to, samarium, neodymium, gadolinium, erbium, and dysprosium. Examples of the Group IVB oxides include, but are not limited to, hafnium oxide and zirconium oxide. Examples of the oriented cubic oxide material having a rock-salt-like structure include, but are not limited to, magnesium oxide, calcium oxide, strontium oxide, zirconium oxide, barium oxide, europium oxide, samarium oxide, and other materials described in Do et al (U.S. Pat. No. 6,190,752).

The present invention can include an initial or base substrate below the oriented cubic oxide material having a rock-salt-like structure. Examples of the initial or base substrate include, but are not limited to, any polycrystalline material (such as polycrystalline metals or polycrystalline ceramics) or a single crystal base substrate (such as lanthanum aluminum oxide, aluminum oxide, or magnesium oxide). For example, the base substrate can be a polycrystalline ceramic such as polycrystalline aluminum oxide, polycrystalline yttria-stabilized zirconia, forsterite, ytrrium-iron-garnet, silica, and the like. Similarly, the base substrate can be a polycrystalline metal such as metal alloys. Nickel-based alloys, such as hastelloy metals, Haynes metals, and Inconel metals, are useful as the base substrate. Likewise, iron-based substrates such as steels and stainless steels are also useful.

The ultimate application can determine the selection of the material for the base substrate. Generally, the initial or base substrate should have a thermal expansion coefficient that is close to that of the wide band gap material deposited upon it which is important for large area devices (i.e., solar photovoltaics) because if the thermal expansion mismatch between substrate and semiconductor is too great, the semiconductor may have stress cracks. Further, the initial or base substrate should have thermal stability or have the ability to undergo high temperature processing such as oxidation, nitriding, and the like because the rare earth zirconates and semiconductors are deposited in elevated temperatures. Still further, the initial or base substrate should be relatively smooth. The IBAD template films are generally very thin making a relatively flat substrate (e.g., ~1 nanometers ("nm") with a scanning area of 5 micrometers ("µm")×5 µm) desirable to allow continuous coating.

A layer of the oriented cubic oxide material having a rock-salt-like structure can be deposited on the initial or base substrate. In one embodiment of the invention, the layer of oriented cubic oxide material having a rock-salt-like structure is MgO. Such MgO layer may be deposited by electron beam evaporation with an ion beam assist. The MgO layer in the IBAD is typically evaporated from a crucible of magnesia. An ion-beam, electron-beam evaporation system similar to that described by Wang et al., App. Phys. Lett., vol. 71, no. 20, pp. 2955-57 (1997), may be used to deposit such a MgO film. Alternatively, a dual-ion-beam sputtering system similar to that described by Arendt et al (U.S. Pat. No. 6,921,741), may be used to deposit such a MgO film. Suitably, the substrate normal to ion-assist beam angle is 45±5.0 degrees.

The ion source gas in the IBAD is typically argon ("Ar"). The IBAD of MgO is conducted with substrate temperatures from about 20° C. to about 100° C. The MgO layer deposited by the IBAD process can be from about 5 nm to about 20 nm in thickness. After deposition of an initial IBAD MgO layer, an additional thin homo-epitaxial layer of the MgO can be optionally deposited by a process such as electron beam or magnetron sputter deposition. This thin layer can generally be up to about 100 nm in thickness. Deposition of the homo-epitaxial layer by such a process can be more readily accomplished than depositing the entire thickness by IBAD.

If no base substrate is used, or a base substrate is used and the oriented cubic oxide material having a rock-salt-like structure has been deposited upon it, then a rare earth-Group IVB oxide buffer with a (111) out-of-plane orientation is deposited on the oriented cubic oxide material having a rock-salt-like structure. The material also has an in-plane orientation. In particular, the Group IVB oxide can be hafnium oxide or zirconium oxide.

This combination of in and out-of-plane orientations result in a buffer film favorable for the subsequent deposition of a c-axis oriented wide band gap semiconductor that has a hexagonal lattice structure. Examples of c-axis oriented wide band gap semiconductors that have a hexagonal lattice structure include, but are not limited to, zinc oxide, silicon carbide, gallium nitride, aluminum nitride, indium nitride (or III-nitrides and their solid solutions), and boron nitride.

In another embodiment of the invention IBAD of MgO with appropriate buffer films can be used for semiconductors with a cubic type crystal structure (e.g., Si, diamond).

Reference is now made in detail to two embodiments of the invention. The first embodiment is the growth of (000/)-oriented ZnO thin films with in-plane twins on single crystal MgO (001) substrates using SZO buffer layers. The second embodiment is the growth of (000/)-oriented ZnO thin films with in-plane twins on SiO$_2$/Si substrates using SZO buffer layers.

To grow high quality ZnO thin films, c-plane sapphire ("Al$_2$O$_3$") wafers are the most used substrates. This is because the c-plane or (000/)-oriented Al$_2$O$_3$ is crystallographically compatible with hexagonal ZnO. However, the large a-axis lattice mismatch (~31%) and the big difference in thermal expansion coefficients between the ZnO and the Al$_2$O$_3$ (~10% along a-axes) make the growth of high crystal quality of ZnO films very difficult. It should also be noted that a (111) terminated surface is necessary if one wants to grow (000/)-oriented ZnO on other cubic crystalline substrates. For example, the deposition of (000/)-oriented ZnO films on silicon substrates needs (111) Si substrates. For technological applications, the integration of high quality (000/)-oriented ZnO thin films with (001) or (100) oriented cubic substrates can give more degrees of freedom to device design. This invention for the first time demonstrates the feasibility of integrating epitaxial hexagonal ZnO films with other technically important cubic materials.

Example 1

For the growth of ZnO films, SZO layers were first grown on single crystal MgO (001) substrates by reactive magnetron sputtering of a Samarium (40 atomic %)-Zirconium (60 atomic %) alloy target. The substrate temperature during SZO depositions was 800° C. and the O$_2$ partial pressure was 15 milli-Torr ("mTorr"). SZO layers were grown to a thickness of about 120 nm at a rate of 4 nm/minute. The composition of the films was determined to be Sm$_{0.28}$Zr$_{0.72}$O$_{2-\delta}$ ("SZO") by Rutherford backscattering spectroscopy.

SZO varies in crystal structure and oxygen content according to the composition. As Sm content increases, the structure changes from fluorite (Fm$\bar{3}$m) to pyrochore (Fd$\bar{3}$m) as shown in FIG. 1 (a and b, respectively) and the oxygen content decreases from zirconium dioxide ("ZrO$_2$") to Sm$_{0.5}$Zr$_{0.5}$O$_{1.75}$ with oxygen vacancies generated for charge neutrality. See A. Navrotsky, J. Mater. Chem. 15, 1883 (2005).

ZnO films with nominal thickness of 100 nm were grown on SZO/MgO using a pulsed xenon chloride ("XeCl") laser operating at a wavelength of 308 nm and a repetition rate of 5 hertz ("Hz"). The target was a stoichiometric ZnO ceramic pellet. The substrate temperature during the deposition was 600° C. The oxygen pressure was maintained at 200 mTorr. The structural properties of the film were characterized by XRD. The optical properties were investigated by PL carried out at room temperature using a helium-cadmium ("He—Cd") laser as a light source at an excitation wavelength of 325 nm.

Figure 2:
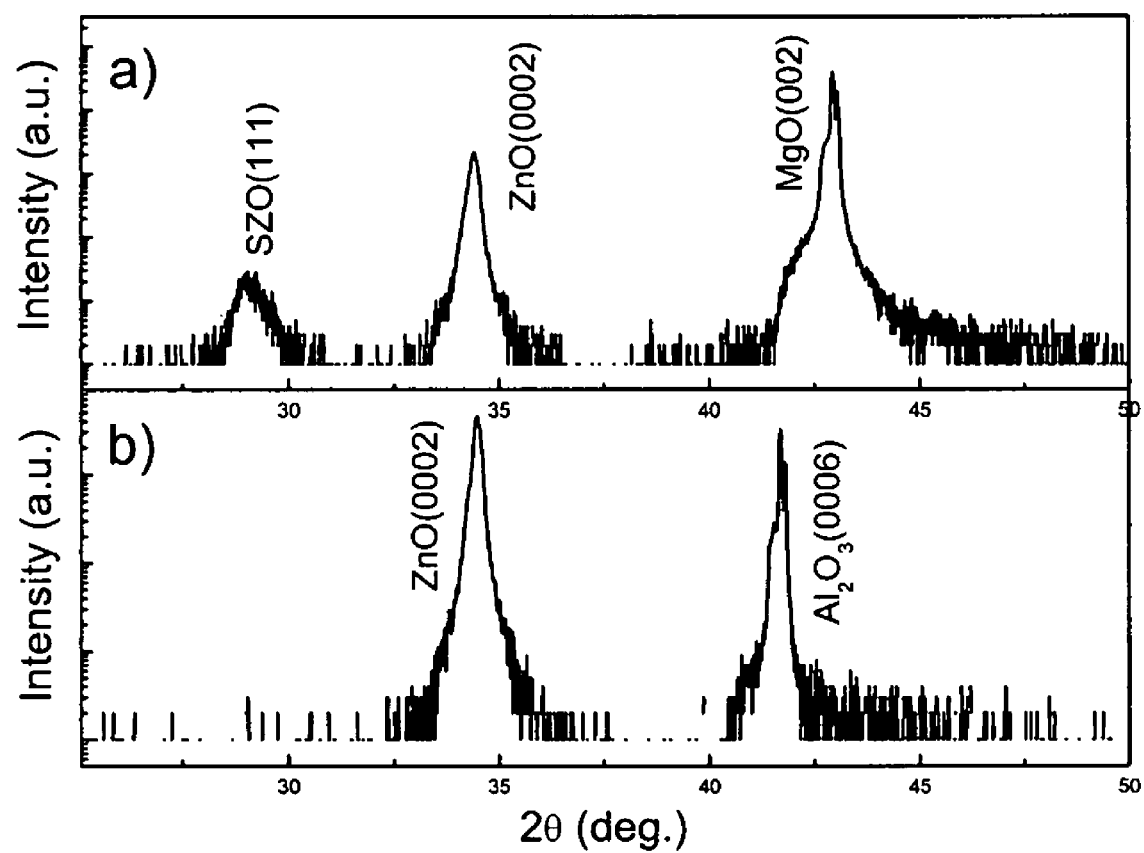
FIG. 2 shows the X-ray diffraction theta-two theta ("XRD $\theta$-$2\theta$") patterns of the zinc oxide ("ZnO") thin film on SZO/magnesium oxide ("MgO") substrate.

FIG. 2 shows the XRD θ-2θ patterns of the ZnO thin film on the SZO/MgO substrate. SZO (111) peak was observed in the film on SZO/MgO. The ZnO layer was grown in (000/) orientation. The full width at half maximum ("FWHM") of the ZnO (0002) peak of the film on SZO/MgO was 0.20°.

Figure 3:
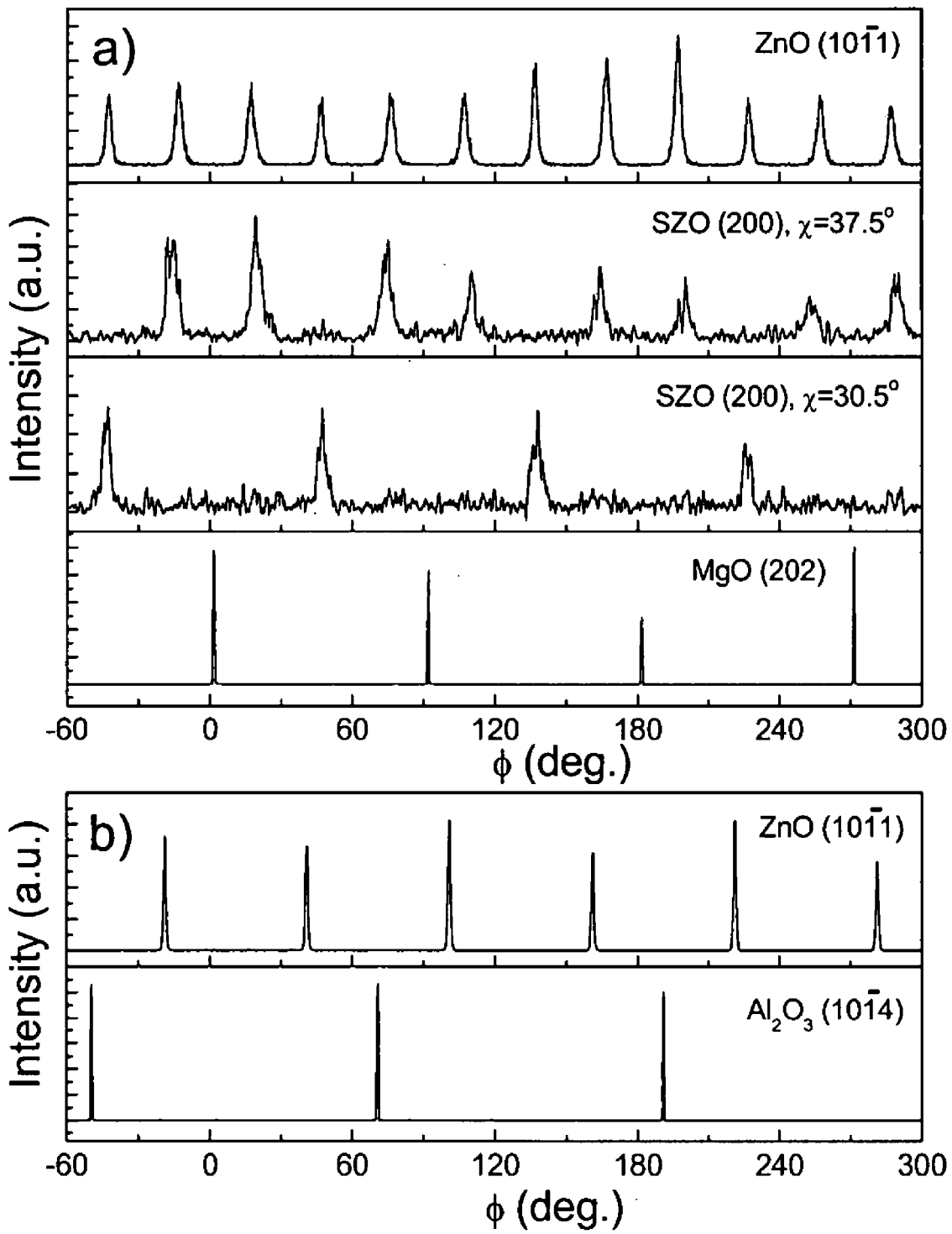
FIG. 3 shows the X-ray diffraction ("XRD") $\phi$ scans of the film on SZO/MgO.

FIG. 3 shows the XRD φ scans of the film on SZO/MgO. Four SZO (200) peaks were found at χ=30.5° at φ values which are 45° off those of MgO (202) peaks, where χ=90° represents the normal direction to the film surface. An additional eight SZO (200) peaks were observed at χ=37.5°.

Figure 4:
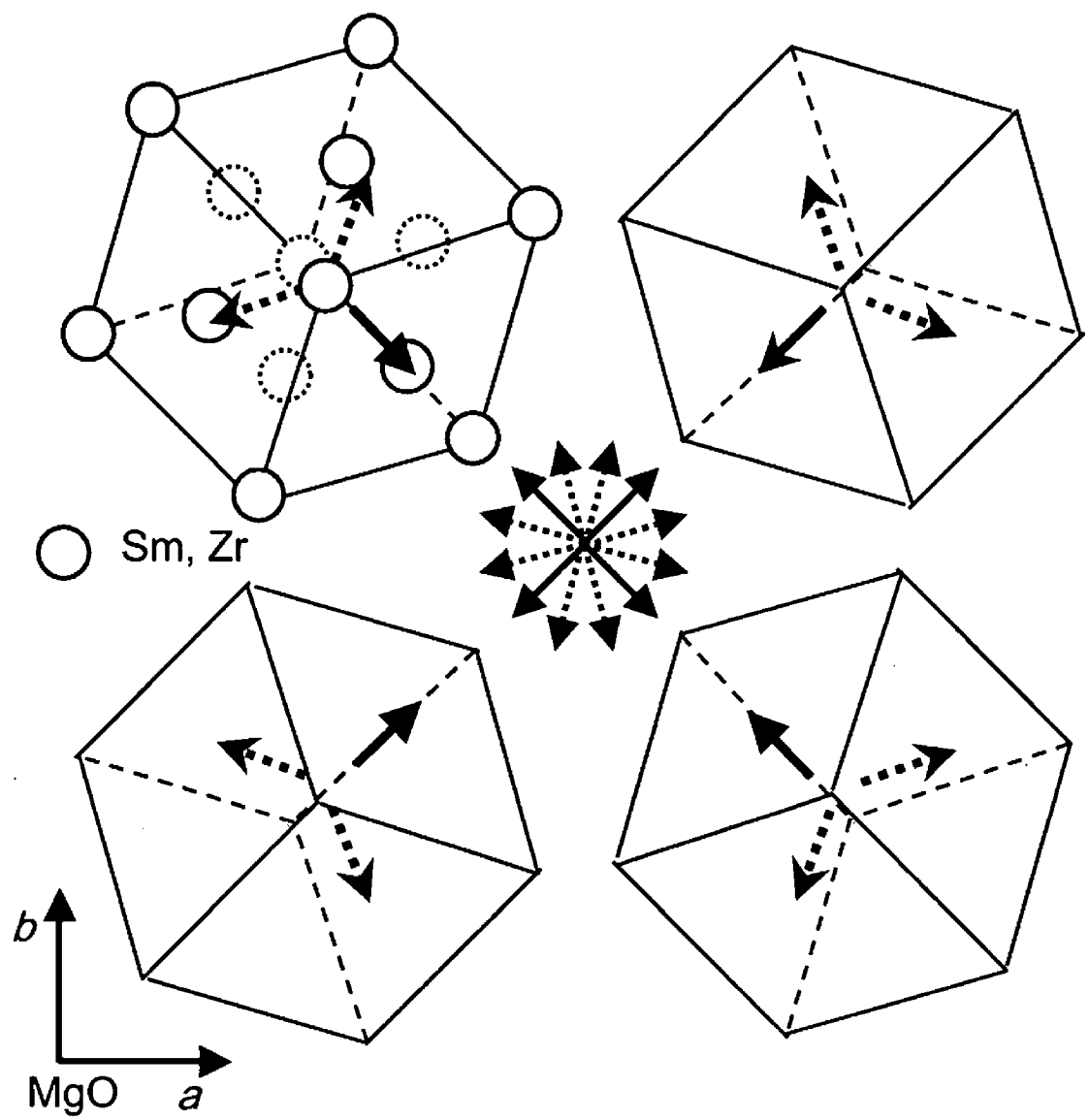
FIG. 4 shows a schematic top-view diagram of the suggested SZO crystal configurations.

FIG. 4 shows a schematic top-view diagram of the suggested SZO crystal configurations. The four tilted cubic crystals represent the four twinned domains. Due to the tilt by about 4°, one of the SZO {200} planes of each domain is oriented to a lower χ (solid arrow), while the remaining two are oriented to a slightly higher χ (dotted arrows). The arrows in the center of the figure are a collection of twelve directions in φ from four domains. The directions of the four solid arrows are identical to those observed in the φ scan with χ=30.5° in FIG. 3. The eight dotted arrows between the solid arrows correspond to the eight peaks observed in the φ scan with χ=37.5° in FIG. 3.

The ZnO film on SZO/MgO was also twinned, affected by the underlying SZO buffer layer. The twelve ZnO (1011) peaks found in FIG. 3 exhibit the twinned nature of the ZnO.

Figure 5:
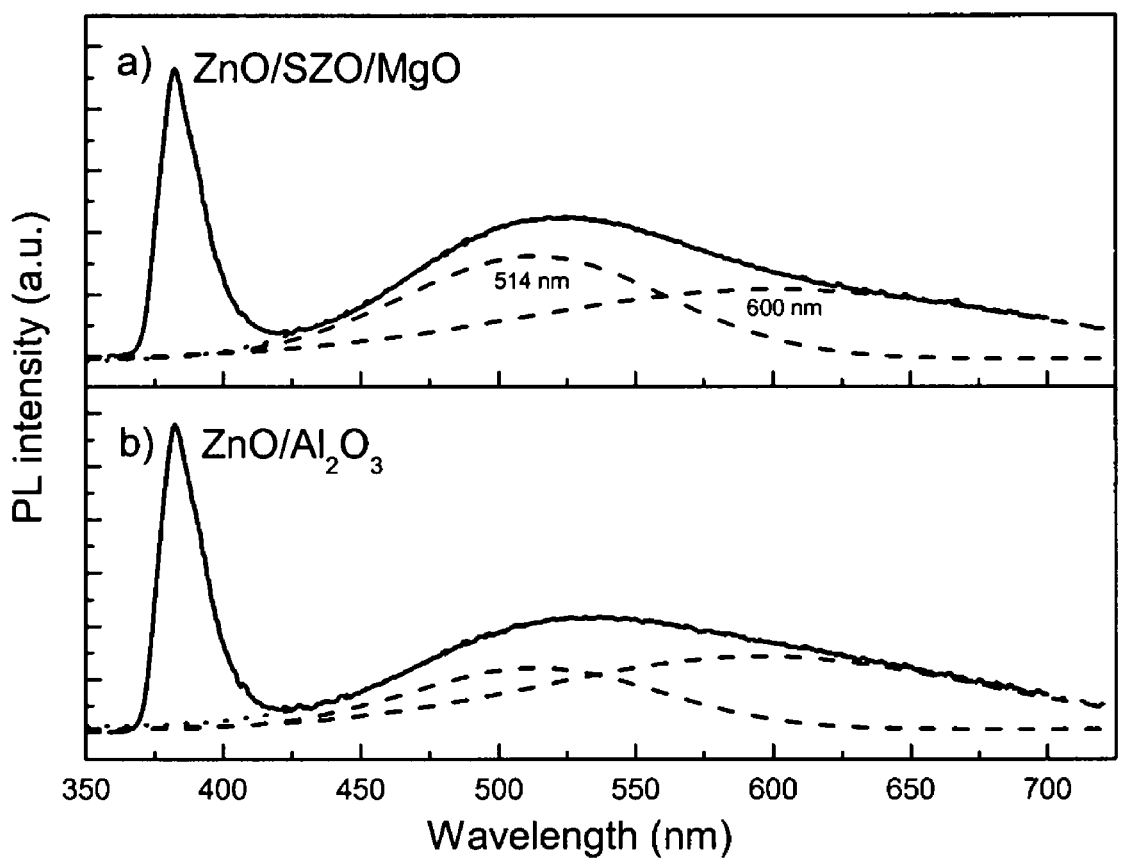
FIG. 5 shows the optical properties of the ZnO film on SZO/MgO substrate investigated via photoluminescence ("PL") measurements at room temperature.

Optical properties of the ZnO films on SZO/MgO were investigated via PL measurements at room temperature as shown in FIG. 5. The spectra showed a prominent ultraviolet ("UV") near band edge emission around 380 nm and a broad asymmetric emission band in the visible region. The spectra in the visible region are well fitted with two Gaussian curves identified as a green-yellow emission at 514 nm (2.40 electron volt ("eV")) and a red emission at 600 nm (2.06 eV).

The accomplishments of epitaxial (111) SZO templates made it possible to grow epitaxial hexagonal (000/)-oriented ZnO thin films on cubic (001) MgO substrates. Both structural and optical properties of ZnO films grown on cubic (001) MgO with the (111) SZO template are comparable to those of the epitaxial ZnO films grown on single crystal c-plane sapphire substrates.

Example 2

Epitaxial hexagonal ZnO films were grown on a SZO template on IBAD-MgO/$Y_2O_3$ on native $SiO_2$/Si substrate. The base substrate was polished silicon on which a 9 nm thick $Y_2O_3$ nucleation layer was deposited by reactive ion beam sputtering at a rate of 0.1 nm/second. It should be noted that the native $SiO_2$ was not purposely removed before $Y_2O_3$ deposition. About 10 nm-thick biaxially oriented MgO (with (001) out-of-plane orientation) was then grown on the $Y_2O_3$/native $SiO_2$/Si substrate by IBAD. The MgO was sputtered from an MgO target at a rate of 0.08 nm/second. The ion bombardment during the MgO growth was performed with 900 eV Ar+ ions at 45° incidence angle. After deposition of an initial IBAD MgO layer, an additional homo-epitaxial layer of the MgO was deposited by magnetron sputter deposition. This layer, about 100 nm in thickness, was necessary for XRD characterization of the MgO. SZO layers were then grown on top of IBAD-MgO (001) surface by reactive magnetron sputtering of a Samarium (40 atomic %)-Zirconium (60 atomic %) alloy target. The substrate temperature during SZO depositions was 800° C. and the $O_2$ partial pressure was 15 mTorr. SZO layers were grown to a thickness of 120 nm at a rate of 4 nm/minute. The composition of the films was determined to be $Sm_{0.28}Zr_{0.72}O_{2-\delta}$ (SZO) by Rutherford backscattering spectroscopy.

The ZnO films were deposited on SZO/IBAD-MgO/$SiO_2$ (native)/Si by pulsed laser deposition using a XeCl excimer laser (λ=308 nm). A substrate temperature of 600° C. and oxygen pressure of 200 mTorr were used during the deposition. After the deposition, the films were cooled in an oxygen atmosphere of 200 Torr without any further in-situ thermal treatment.

Figure 6:
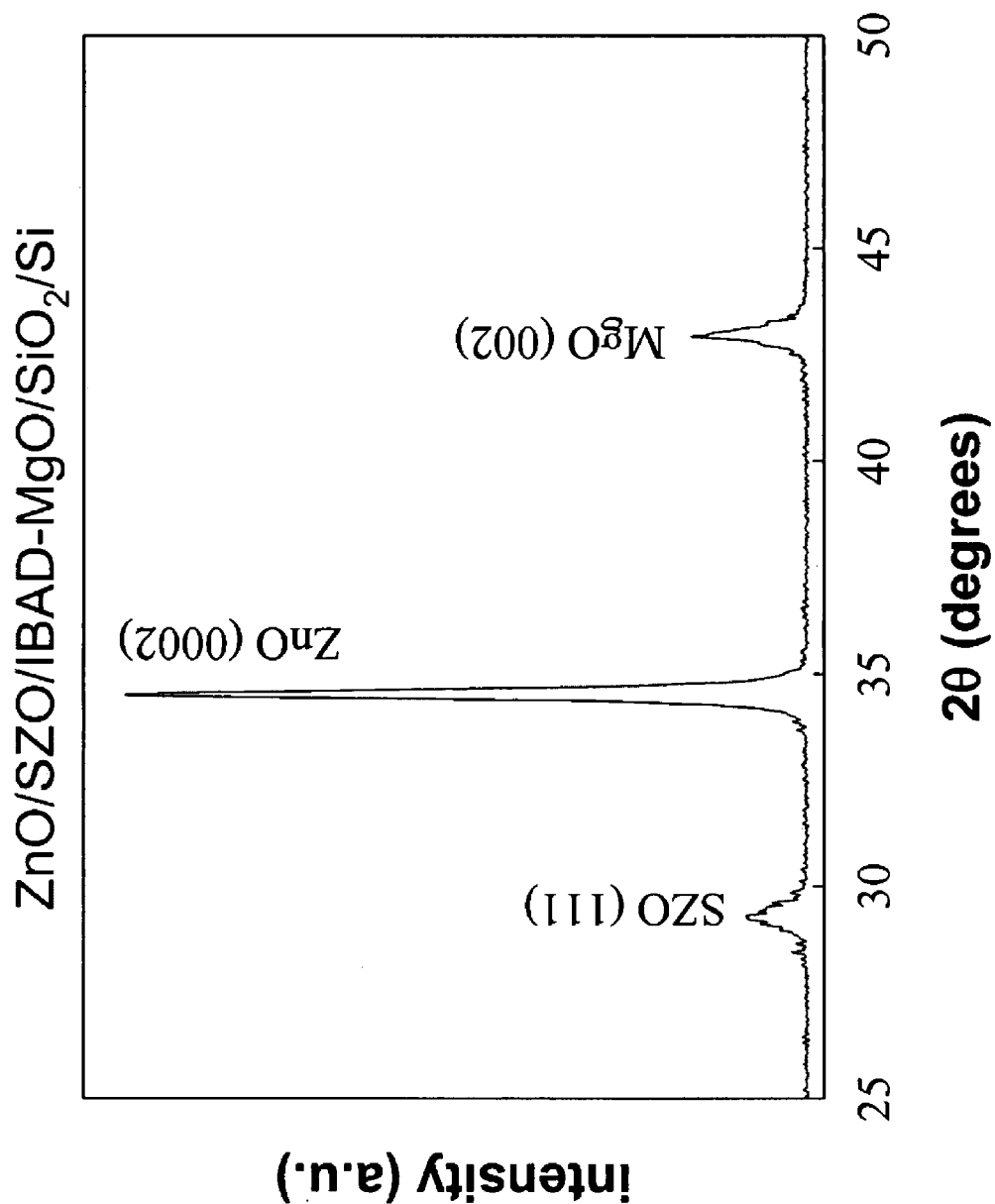
FIG. 6 shows the XRD $\theta$-$2\theta$ patterns of the ZnO thin film on the SZO/ion beam assisted deposition ("IBAD")-MgO/yttrium oxide ("$Y_2O_3$")/silicon dioxide ("$SiO_2$") (native)/silicon ("Si") substrate.

FIG. 6 shows the XRD θ-2θ patterns of the ZnO thin film on the SZO/IBAD-MgO/$Y_2O_3$/$SiO_2$ (native)/Si substrate. Diffraction (111) peak was observed for SZO and diffraction (002) peak was observed for MgO. FIG. 6 shows the ZnO was oriented as (000/).

Figure 7:
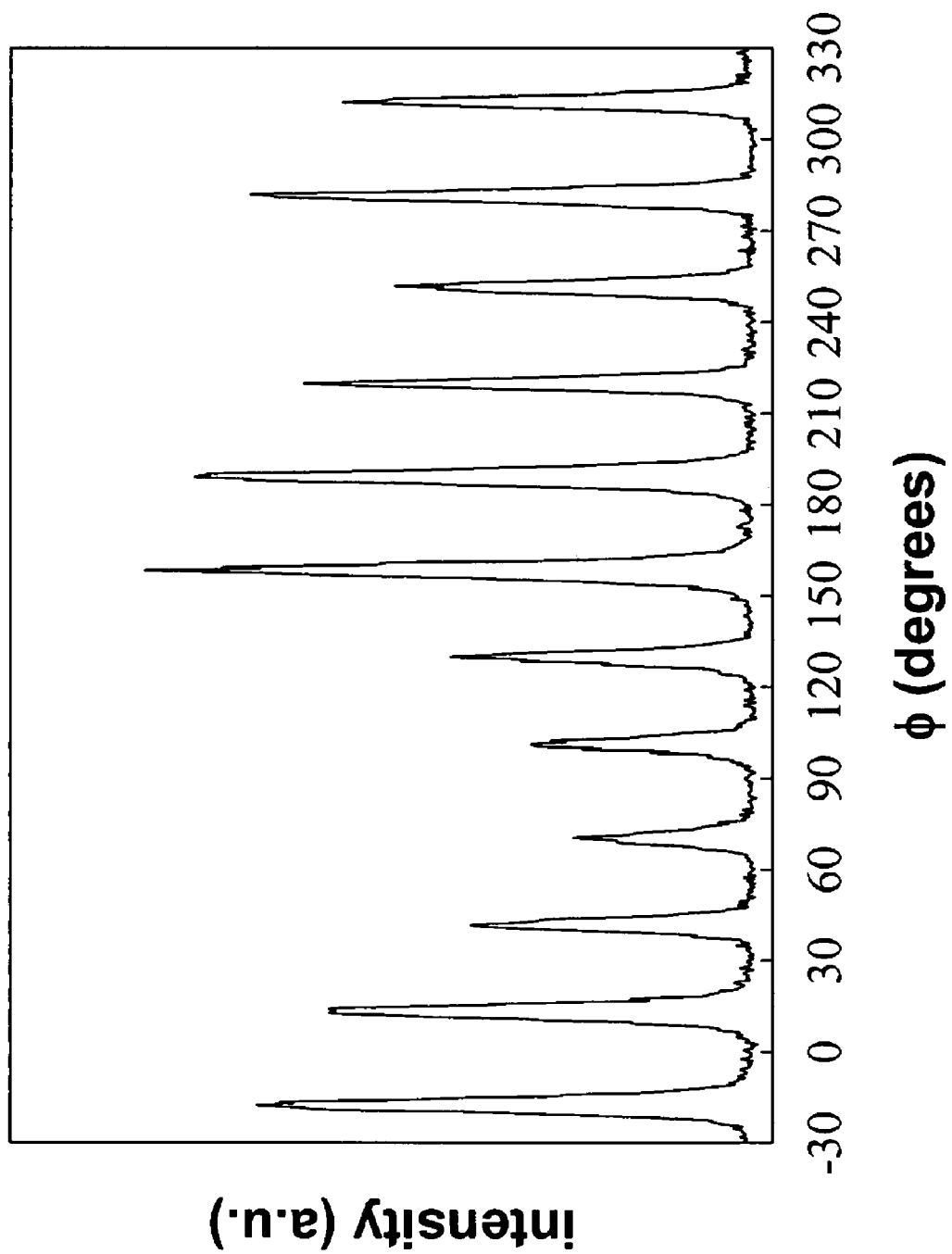
FIG. 7 shows the XRD $\phi$ scan of (101) ZnO on SZO/IBAD-MgO/$Y_2O_3$/$SiO_2$ (native)/Si.

FIG. 7 shows the XRD φ scan of (101) ZnO on SZO/IBAD-MgO/$Y_2O_3$/$SiO_2$ (native)/Si. As a comparison with ZnO film epitaxially grown on c-plane sapphire (FIG. 3), the ZnO film on SZO/IBAD-MgO/$Y_2O_3$/$SiO_2$ (native)/Si is twinned in-plane. Similar in-plane twinning was observed for ZnO grown on SZO/single-crystal MgO. This twinning of ZnO film is the consequence of the twinned and tilted structure of SZO template on cubic MgO surface.

The accomplishments of epitaxial (111) SZO templates on IBAD-MgO made it possible to grow epitaxial hexagonal (000/)-oriented ZnO thin films on any substrates where a cubic (001) MgO template is deposited. Substrate surface termination is no longer limiting. For example, one can use polycrystal substrates, or substrates of amorphous materials. This makes it possible to integrate c-axis oriented wideband semiconductors with many technologically important substrates.

It is understood that the foregoing detailed description and Examples are merely illustrative and are not to be taken as limitations upon the scope of the invention, which is defined by the appended claims. Various changes and modifications to the disclosed embodiments will be apparent to those skilled in the art. Such changes and modifications, including without limitation those relating to syntheses, formulations, and/or methods of use of the invention, may be made without departing from the spirit and scope thereof.

All publications, patents, and patent applications cited in this specification are herein incorporated by reference as if each individual publication or patent application were specifically and individually indicated to be incorporated by reference.

We claim:

1. A thin film template structure comprising: a layer of a rare earth-Group IVB oxide buffer having a (111) out-of-plane orientation upon a layer of an oriented cubic oxide material having a rock-salt-like structure.

2. The structure of claim 1 wherein said rare earth-Group IVB oxide buffer is either rare earth-hafnium oxide or rare earth-zirconium oxide.

3. The structure of claim 2 wherein said oriented cubic oxide material having a rock-salt-like structure is magnesium oxide.

4. The structure of claim 3 wherein said layer of a rare earth-Group IVB oxide buffer is samarium zirconate.

5. The structure of claim 1 further including a layer of c-axis oriented wide band gap semiconductor upon said rare earth-Group IVB oxide buffer.

6. The structure of claim 5 wherein said rare earth-Group IVB oxide buffer is either rare earth-hafnium oxide or rare earth-zirconium oxide.

7. The structure of claim 6 wherein said layer of c-axis oriented wide band gap semiconductor has a hexagonal lattice structure.

8. The structure of claim 6 wherein said layer of c-axis oriented wide band gap semiconductor is zinc oxide.

9. A thin film template structure comprising: a substrate; a layer of an oriented cubic oxide material having a rock-salt-like structure upon said substrate; and a layer of a rare earth-Group IVB oxide buffer having a (111) out-of-plane orientation upon said layer of an oriented cubic oxide material having a rock-salt-like structure.

10. The structure of claim 9 wherein said rare earth-Group IVB oxide buffer is either rare earth-hafnium oxide or rare earth-zirconium oxide.

11. The structure of claim 10 wherein said layer of an oriented cubic oxide material having a rock-salt-like structure is deposited upon said substrate by ion beam assisted deposition.

12. The structure of claim 11 wherein said oriented cubic oxide material having a rock-salt-like structure is magnesium oxide.

13. The structure of claim 12 wherein said layer of a rare earth-Group IVB oxide buffer is samarium zirconate.

14. The structure of claim 13 wherein said substrate is selected from polycrystalline metal, polycrystalline ceramic, a single crystal ceramic, or an amorphous ceramic.

15. A thin film structure comprising: a substrate; a layer of an oriented cubic oxide material having a rock-salt-like structure upon said substrate; a layer of a rare earth-Group IVB oxide buffer having a (111) out-of-plane orientation upon said layer of an oriented cubic oxide material having a rock-salt-like structure; and a layer of c-axis oriented wide band gap semiconductor upon said layer of rare earth Group IVB oxide buffer.

16. The structure of claim 15 wherein said rare earth-Group IVB oxide buffer is either rare earth-hafnium oxide or rare earth-zirconium oxide.

17. The structure of claim 16 wherein said layer of an oriented cubic oxide material having a rock-salt-like structure is deposited upon said substrate by ion beam assisted deposition.

18. The structure of claim 17 wherein said oriented cubic oxide material having a rock-salt-like structure is magnesium oxide.

19. The structure of claim 18 wherein said rare earth-Group IVB oxide buffer is samarium zirconate.

20. The structure of claim 19 wherein said layer of c-axis oriented wide band gap semiconductor has a hexagonal lattice structure.

21. The structure of claim 19 wherein said layer of c-axis oriented wide band gap semiconductor is zinc oxide.

22. The structure of claim 20 wherein said substrate is selected from polycrystalline metal, polycrystalline ceramic, a single crystal ceramic, or an amorphous ceramic.

23. The structure of claim 21 wherein said substrate is selected from polycrystalline metal, polycrystalline ceramic, a single crystal ceramic, or an amorphous ceramic.

* * * * *